(12) United States Patent
Mooney et al.

(10) Patent No.: US 12,057,515 B2
(45) Date of Patent: Aug. 6, 2024

(54) ELECTRONIC IMAGING DETECTOR WITH THERMAL CONDUCTION LAYER

(71) Applicant: Gatan, Inc., Pleasanton, CA (US)

(72) Inventors: Paul Mooney, Pleasanton, CA (US); Matthew Lent, Livermore, CA (US); Julio Kovacs, Pleasanton, CA (US); David Joyce, Livermore, CA (US)

(73) Assignee: GATAN, INC., Pleasanton, CA (US)

( * ) Notice: Subject to any disclaimer, the term of this patent is extended or adjusted under 35 U.S.C. 154(b) by 93 days.

(21) Appl. No.: 17/130,666

(22) Filed: Dec. 22, 2020

(65) Prior Publication Data

US 2021/0193848 A1   Jun. 24, 2021

Related U.S. Application Data

(60) Provisional application No. 62/952,852, filed on Dec. 23, 2019.

(51) Int. Cl.
*H01L 31/024* (2014.01)
*H01L 27/146* (2006.01)

(52) U.S. Cl.
CPC ........ *H01L 31/024* (2013.01); *H01L 27/1464* (2013.01); *H01L 27/14685* (2013.01)

(58) Field of Classification Search
CPC ............... H01L 31/024; H01L 27/1464; H01L 27/14685; H01L 27/14676; H01L 27/14658; H01L 31/00; H01L 27/305; H01L 27/144
USPC ......................................................... 257/460
See application file for complete search history.

(56) References Cited

U.S. PATENT DOCUMENTS

| | | | | |
|---|---|---|---|---|
| 5,441,803 A | * | 8/1995 | Meissner | H01S 3/0625 156/60 |
| 5,852,622 A | * | 12/1998 | Meissner | B32B 37/00 372/39 |
| 9,397,134 B1 | * | 7/2016 | Lewkow | H01L 27/14632 |
| 2011/0089517 A1 | * | 4/2011 | Venezia | H01L 27/14603 257/443 |
| 2013/0183792 A1 | * | 7/2013 | Kudo | H01L 27/1464 257/E31.127 |

(Continued)

FOREIGN PATENT DOCUMENTS

| | | | | |
|---|---|---|---|---|
| JP | 06318690 A | * | 11/1994 | ............. H01L 27/14 |
| JP | 06-350068 A | | 12/1994 | |

(Continued)

OTHER PUBLICATIONS

Extended European Search Report dated May 4, 2021 for European Application No. EP 20215917.4.

(Continued)

*Primary Examiner* — Herve-Louis Y Assouman
(74) *Attorney, Agent, or Firm* — Volpe Koenig (57) ABSTRACT

A solid state active pixel image sensor for back illumination by an electron beam is described. The image sensor comprises a thermal conduction layer for heat removal. The image sensor may also comprise a thinned silicon substrate on which an epitaxial layer is formed. The substrate may also be completely removed before or after application of the thermal conduction layer. The thermal conduction layer may comprise a metal, a metal compound, silicon, diamond or graphite.

10 Claims, 7 Drawing Sheets

(56) References Cited

U.S. PATENT DOCUMENTS

| | | | | |
|---|---|---|---|---|
| 2013/0264481 A1* | 10/2013 | Chern | ............... | H01L 27/14603 |
| | | | | 257/443 |
| 2014/0291790 A1* | 10/2014 | Hsiao | .................. | H01L 27/1464 |
| | | | | 257/447 |
| 2017/0104019 A1* | 4/2017 | Jung | ................... | H01L 27/1462 |
| 2017/0356953 A1* | 12/2017 | Wang | ...................... | H01L 22/30 |
| 2018/0277530 A1* | 9/2018 | Or-Bach | ............. | H01L 21/7806 |

FOREIGN PATENT DOCUMENTS

| | | | | | |
|---|---|---|---|---|---|
| JP | 06350068 | A | * 12/1994 | ............. | H01L 27/14 |
| JP | H06350068 | A | 12/1994 | | |
| JP | 2007027585 | A | 2/2007 | | |
| JP | 2008226553 | A | 9/2008 | | |
| WO | WO-2021014849 | A1 | * 1/2021 | ........... | H01L 27/146 |

OTHER PUBLICATIONS

Shen Yang et al: "Thermal Analysis of High-Power Flip-Chip-Bonded Photodiodes", Journal of Lightwave Technology, IEEE, USA, vol. 35, No. 19, (Oct. 1, 2017).
Andreas Beling et al: "High-power, high-linearity photodiodes", OPTICA, vol. 3, No. 3, (Mar. 20, 2016).
Japanese Office Action mailed on Dec. 22, 1994 for Japanese Patent Application No. 06-350068.

* cited by examiner

ELECTRONIC IMAGING DETECTOR WITH THERMAL CONDUCTION LAYER

CROSS REFERENCE TO RELATED APPLICATION

This application claims priority under 35 U.S.C. § 119, based on U.S. Provisional Application No. 62/952,852, filed Dec. 23, 2019, the disclosure of which is hereby incorporated by reference herein.

BACKGROUND

Electron imaging detectors based on thinned transmission silicon active pixel sensors have revolutionized cryo-electron microscopy. These devices have enabled scientists to investigate the structure of large biological macromolecules at levels not achieved previously. Because these are transmission devices, electrons which have interacted with the detection layer ideally exit the sensor without being scattered back into the detection layer. The use of silicon as the sensor substrate minimizes the scatter of electrons within the sensor back into the detection layer. Active sensors maximize the signal to noise ratio for detecting positions of individual incoming electrons through amplification of electron signals.

Figure 1:
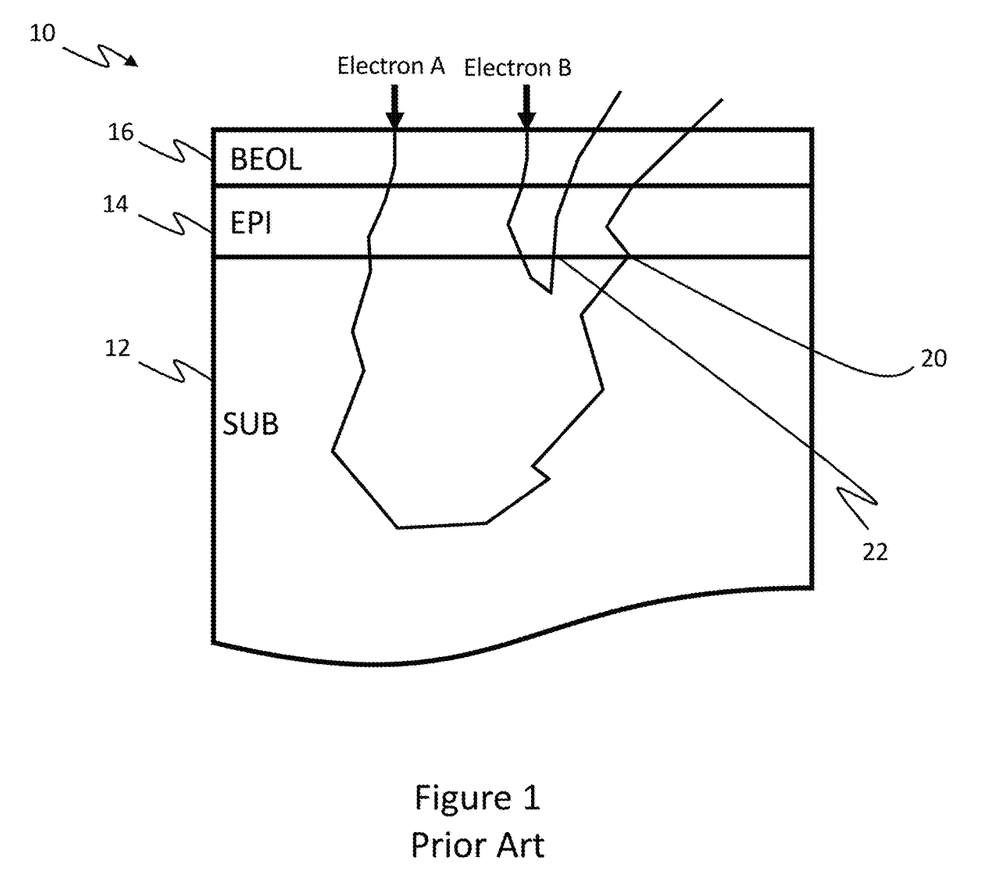
FIG. 1 is a cross section of a prior art silicon imaging detector.

As shown in FIG. 1, an active pixel sensor 10 is built up in three layers: a substrate (SUB) layer 12, an epitaxially grown detection (EPI) layer 14, and a back-end-of-line (BEOL) layer 16. SUB layer 12 is inert from the standpoint of detecting electrons and is used as the base on which to form the detection layers. EPI layer 14 includes a material that generates sensor electrons in response to incoming electron microscope electrons. These sensor electrons are collected. BEOL layer 16 is provided above EPI layer 14 and contains metal interconnects and oxide insulation for reading out the sensor.

In some known electron imaging detectors, SUB layer 12 is thick enough that no electrons pass all the way through it. Two example electron paths are shown in FIG. 1. Electrons paths A and B are scattered by the substrate back into the EPI detection layer 14 and are detected a second time at locations 20, 22, which are less correlated with the actual entry points of the backscattered electrons into EPI layer 14. This extra detection reduces imaging quality. Thinning SUB layer 12 from the back can reduce backscatter and the secondary detections, as shown in FIG. 2, where electron A does not backscatter up into the detection layer 14.

Figure 2:
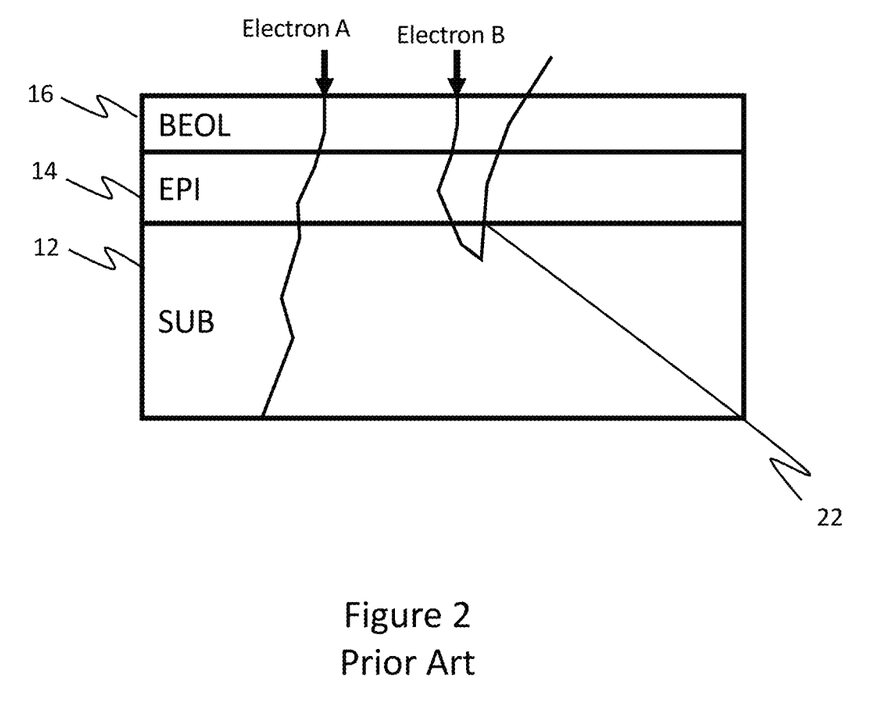
FIG. 2 is cross section of another prior art silicon imaging detector.

In the example image using the same electron paths, in FIG. 2, electron A, which penetrated the substrate layer to greater depth, is no longer scattered back to the detection layer. Electron B, which is scattered at a shallower depth, still returns to the detection layer. Backscatter can be minimized by minimizing the amount of substrate in this front-illuminated configuration.

Thinning the substrate reduces the available material for removal of heat from the device. As the number of pixels per a given area is increased by advances in process technology, heat removal becomes an ever greater problem.

DETAILED DESCRIPTION

Those skilled in the art will recognize other detailed designs and methods that can be developed employing the teachings of the present invention. The examples provided here are illustrative and do not limit the scope of the invention, which is defined by the attached claims. The following detailed description refers to the accompanying drawings. The same reference numbers in different drawings may identify the same or similar elements.

Figure 3:
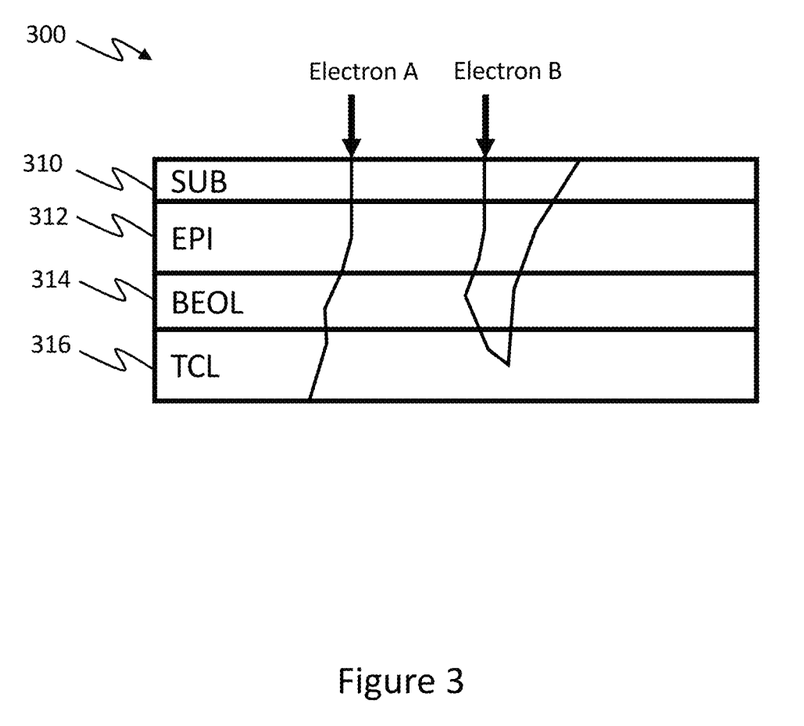
FIG. 3 is a cross section of an exemplary silicon imaging detector according to implementations described herein.

In accordance with embodiments described herein, as shown in FIG. 3, an active pixel silicon imaging detector 300 comprises a SUB layer 310, an EPI layer 312, a BEOL layer 314, and a thermal conduction layer ("TCL") 316. TCL 316 is applied to the BEOL layer 314 after manufacture of the BEOL layer. Consistent with embodiments described herein, detector 300 is exposed to incoming electrons initially from the substrate side 310, i.e., the sensor is "back-illuminated." The sensor is back-illuminated because some scattering also occurs in the BEOL, which, in a front-illuminated configuration, lies in front of the detection EPI layer. While pre-detection scatter by the BEOL has little or no effect on the number of detections per incoming electron, the scatter may reduce the spatial correlation between entry point and detection point and may therefore limit the ultimate resolution of the detector. The BEOL cannot be removed as it performs the necessary readout function of the detector. However, back-illumination places the BEOL after the EPI detection layer and eliminates the pre-detection scatter caused by the BEOL.

As shown in FIG. 3, electrons A and B are detected in the EPI layer 312 and then pass through the BEOL layer 314. The thermal conduction layer 316 is designed both in thickness and material composition to have a high thermal conductivity but a low propensity to reflect electrons back into the EPI detection layer 312. Prior art substrate thickness has been in the range of 10 um to 40 um yielding backscatter fractions from less than 2% to more than 10% for 200 kV and 300 kV electrons. It would be advantageous to reduce that backscatter fraction through reduced Z (atomic number) of the thermal conduction substrate or by reducing the thickness which would be possible with a higher thermal conductivity. In practice materials vary by both these parameters simultaneously. As shown in FIG. 3, Electron A, passes out of the TCL layer 316 without being reflected back into the sensor. Electron B is reflected by the TCL layer and detected a second time in the detection layer 312. The thickness of the TCL layer and its composition determine the likelihood of electrons passing through the TCL layer or being reflected back into the sensor 300.

Figure 4A:
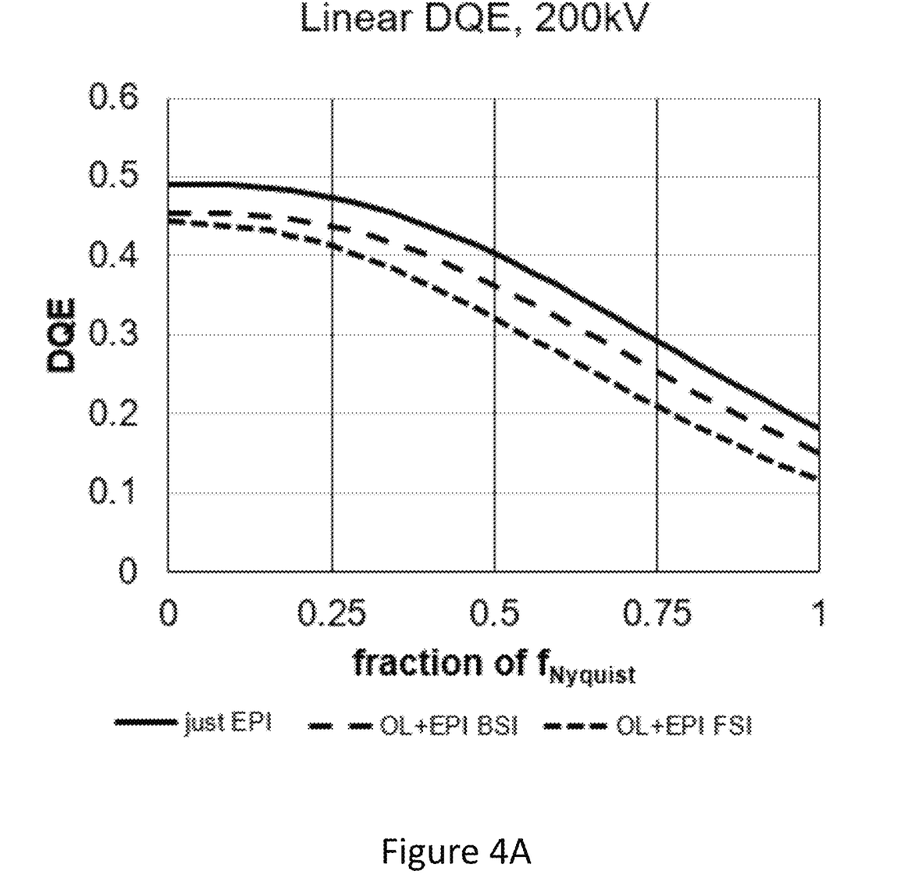
FIG. 4A is a graph showing detective quantum efficiency (DQE) for ideal, front, and back illuminated imaging sensors.
Figure 4B:
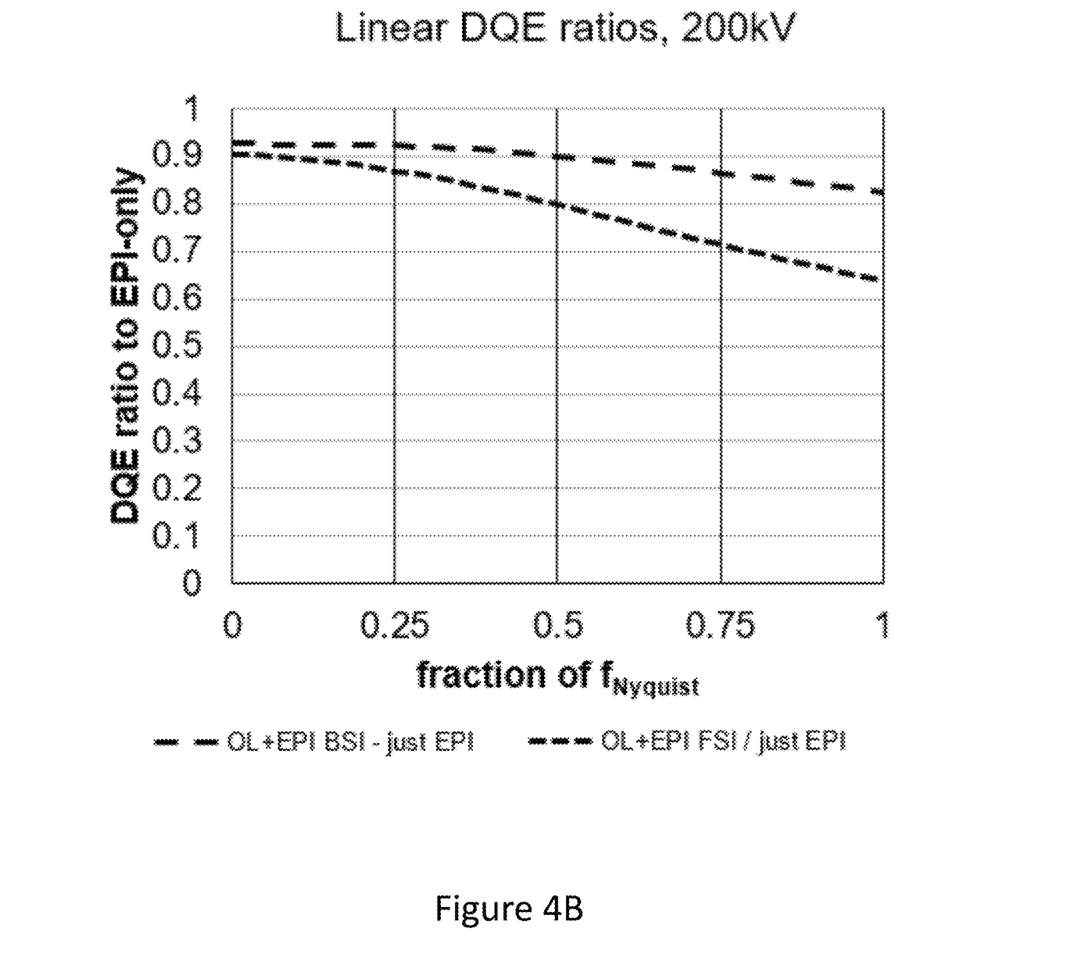
FIG. 4B is a graph comparing DQE for front versus back illuminated imaging sensors to the ideal sensor DQE curve in FIG. 4A.

FIG. 4A shows simulated linear detective quantum efficiency (DQE) for three configurations: the solid curve is for an idealized epitaxial layer only ("just EPI"), the middle curve (large dashes) is for a back side illuminated device having a BEOL and epitaxial layer wherein the epitaxial layer is exposed to the electrons directly and the lower curve (short dashes) is for a front side illuminated device having a BEOL and an epitaxial layer (i.e., illuminated through the BEOL). FIG. 4B show simulated ratios of the DQE for the two sensors of FIG. 4A having a BEOL, as compared to the idealized epitaxial layer only sensor curve of FIG. 4A.

Both graphs (FIGS. 4A, 4B) show performance as quantified by linear DQE vs. spatial frequency. Zero spatial frequency at the origin on the left of each graph corresponds to performance of the detector functioning as a whole. Spatial frequency of one times the Nyquist frequency at the right of each graph shows performance for modulations of image signal which go high and low every other pixel. This is the highest spatial modulation frequency that can be acquired by a pixelated detector without aliasing errors.

FIGS. 4A and 4B show that while material on both the entrance and exit faces of the detector increases scatter at increasing levels of spatial frequency, the scatter that occurs post-detection from material mounted on the exit face (large dash curve in both graphs) is less damaging to high-resolution signal quality. The simulation results also imply that any material in front of the EPI detection layer should be minimized. Exposing the sensor from the back side as in FIG. 3 leaves substrate in front of the epitaxial layer. The conclusion from FIGS. 4A and 4B is that anything in front of the EPI detection layer reduces DQE, which means that all or most of the substrate (leaving no more than 5 microns), now at the entrance surface, should be removed. Up to now this has been impractical due to the role played by the substrate in providing mechanical support and heat conduction for the sensor. Consistent with embodiments herein, a thermal conduction layer can support the EPI and BEOL layers from the BEOL layer side (i.e. the exit side in a back-side illuminated configuration). Supporting the device with a layer next to the BEOL layer enables complete removal of the original substrate layer. This in turn allows for direct exposure of the EPI layer, which heretofore has not been possible.

Because the thermal conduction layer is not part of the original sensor fabrication (i.e. not part of the growth of the epitaxial layer or the deposition of the BEOL layer), there is an opportunity to find a thermal layer material better than silicon (which comprises the original substrate and most of the heat removal in prior art devices) for the purpose. The thermal conductivity layer material can be better than the original silicon substrate in two ways. It can have a better thermal conductivity and it can have a lower tendency to scatter electrons. The benefit of the combined effects is proportional to thermal conductivity $\kappa$ and inversely proportional to the square of atomic number Z. A heuristic quality factor for the purpose of an electron-transmissive thermal conduction layer can be defined as $Q=\kappa/Z^2$. The following table summarizes estimates of $\kappa$, Z and Q for some representative materials. The estimates of $\kappa$ and therefore also of Q are subject to manufacturing method, binder fraction, etc. The table is not meant to be exhaustive but illustrative of the principal used for identifying materials as more or less suited for an electron-transmissive thermal conductive layer as/than silicon.

TABLE 1

| Material | min thermal conductivity (W/mK) | stoichiometric average atomic number (Z) | quality factor $Q = \kappa/Z^2$ |
|---|---|---|---|
| aluminum | 170 | 13 | 1.01 |
| aluminum nitride | 180 | 10 | 1.80 |
| diamond | 1000 | 6 | 27.78 |
| pyrolized graphite | 700 | 6 | 19.44 |
| beryllium | 200 | 4 | 12.50 |
| beryllium oxide | 265 | 6 | 7.36 |
| boron nitride | 1700 | 6 | 47.22 |
| silicon | 190 | 14 | 0.97 |

Due to the fragility of the thin EPI detector layer, especially after removal of all substrate material, methods for attachment of a thermally conductive layer to the thin device must either be very low force/pressure or a robust temporary support for the thin layers must be provided as part of any higher pressure process step. Methods for affixing a thermal conduction layer to the BEOL of the back-illuminated sensor vary depending on the conduction material.

Solid refractory dielectrics, including but not limited to boron nitride, beryllium oxide and diamond can be contact bonded onto the sensor BEOL either with or without temperature elevation and with or without applied pressure, followed by removal of excess thermal conduction layer material and also removal of the silicon substrate layer. Contact bonding is described in U.S. Pat. Nos. 5,852,622 and 5,441,803, which are incorporated by reference herein. The substrate is left intact at first, to allow pressure applied for contact bonding of the thermal layer to the BEOL.

Figure 5A:
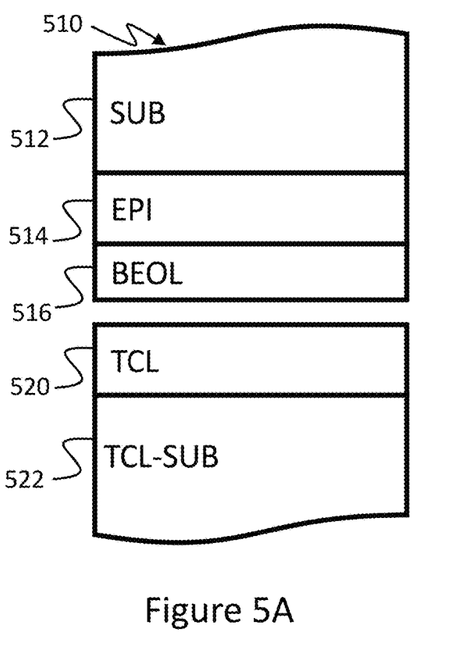
FIGS. 5A-C are cross sections of processing stages for an exemplary silicon imaging detector according to embodiments described herein.
Figure 5B:
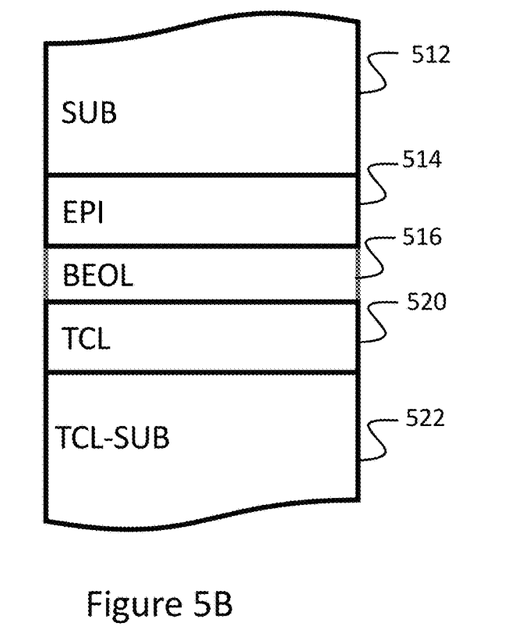
Figure 5C:
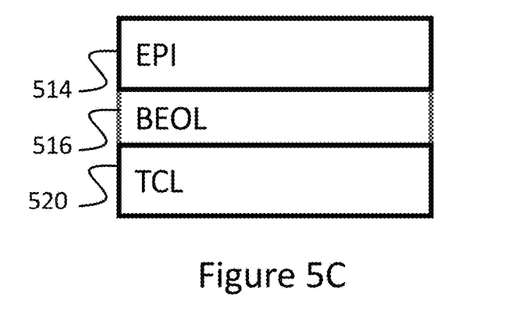

FIGS. 5A-5C show cross sections of the manufacturing process for an imaging sensor according to an aspect of the invention. FIG. 5A shows a sensor 510 comprising a silicon substrate 512, an epitaxial layer 514 and a BEOL 516. FIG. 5A also shows a thermal conduction layer 520 supported by a thermal conduction layer substrate 522. The TCL substrate 522 can be the same or different material as the TCL itself. FIG. 5B shows the bonding of the BEOL 516 of the sensor 510 to the thermal conduction layer 520. At this stage, both the imaging sensor 510 and the thermal conduction layer are supported by substrates 512, 522 to allow pressure to be applied in a contact bonding process. Note that contact bonding may be performed in some embodiments with or without pressure and with or without temperature elevation. FIG. 5C shows the completed imaging sensor 510 with the original sensor substrate 512 removed and the thermal conduction layer substrate 522 removed. Removal of substrate material or excess thermal conduction material can be accomplished by a variety of means including, but not limited to, polishing, chemo-mechanical polishing, ion milling, and laser ablation. The resulting sensor shown in FIG. 5C has an unhindered epitaxial sensing layer 514 that can be directly exposed to electrons without any initial scattering, plus a thermal conduction layer 520 to remove heat from the device as well as physically support the device.

The thermal conduction layer to be contact bonded to the sensor can be derived from a variety of initial starting forms and processed in a variety of ways. Consistent with embodiments described herein, the TCL/SUB layer 502/522 bonded to the BEOL can be made of a single material which is thicker than the final TCL 520. The extra thickness is necessary for strength in the bonding process. The layer is contact bonded onto the BEOL layer of the sensor and the extra material is polished off. In this case the ultimate thickness of the thermal conduction layer is determined by close monitoring of the thickness during polishing.

In a further embodiment, a single material thicker than the final thermal conduction layer is used as a starting material, but the starting material is ion-implanted on the side to be bonded to a predetermined depth. This ion implantation changes the etch rate for a chemical or chemo-mechanical thinning process without changing the thermal or scattering properties of the thermal conduction layer material. Once bonded to the BEOL layer, the thermal conduction material is thinned. The etch stop created by the ion implantation increases the reliability of achieving a given thickness thermal conduction layer.

In a further embodiment, the thermal conduction layer is epitaxially grown or chemical vapor deposited onto a substrate of a different material than the grown or deposited layer. The substrate is used as a transfer layer. The combined layers are contact bonded to the BEOL layer as above. Once bonded to the BEOL layer the substrate material is removed by one or more of the processes described above.

In a further embodiment, a thermally conductive powder layer is sintered onto a substrate of similar melting point and coefficient of thermal expansion as the powder. The substrate acting as a transfer layer. The combined layers are contact bonded to the BEOL layer, followed by complete removal of the substrate material after contact bonding.

Figure 6A:
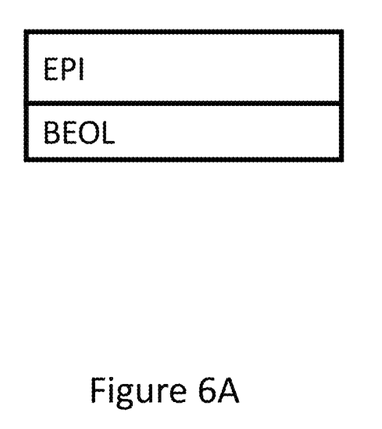
FIGS. 6A-C are cross sections of processing stages for an exemplary silicon imaging detector according to embodiments described herein.
Figure 6B:
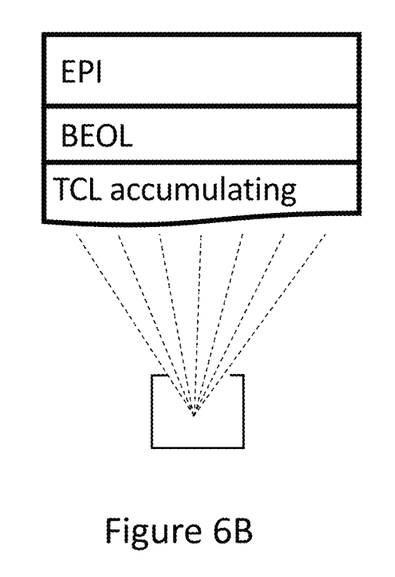
Figure 6C:
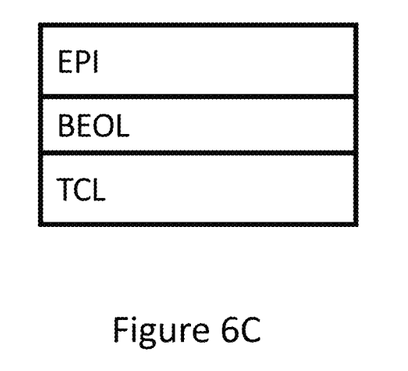

Metal layers can be sputtered onto the BEOL. FIGS. 6A-C show cross sections of an exemplary sputtering deposition of a thermal conduction layer 616 onto a BEOL 614. FIG. 6A shows a sensor 610 comprising an epitaxial layer 612 and a BEOL 614. The original substrate on which the sensor was developed has already been removed in this embodiment. FIG. 6B shows the sputtering of material onto the BEOL to create a thermal conduction layer 616. FIG. 6C shows a completed sensor with a fully deposited thermal conduction layer 616, Powder-based materials can be applied by settling or slurry coating processes in a solvent-thinned binder such as is done for powder phosphor scintillators. The powder-binder mixture is applied to the BEOL layer by means including silk screening or gravitational settling. A liquid powder suspension may also be spin coated onto the BEOL layer. Exemplary binders include but are not limited to sodium silicate, ethyl cellulose, and ammonium polymethacrylate, and cellulose nitrate. While a binder sacrifices some of the thermal conductivity, given the extremely high conductivity of a graphite or boron nitride powder and given sufficiently low binder fraction, the net conductivity will still constitute an improvement over silicon.

Powder-based thermal conductors can also be deposited directly onto the BEOL layer by spin-coating of a liquid powder suspension.

In a further embodiment, the starting material for a thermal conductor layer is a flexible sheet comprising a flexible polymer embedding medium for powder heat conduction material. The flexible sheet material can be contact bonded in vacuum to prevent gas entrapment, with or without temperature elevation. The material should be affixed to the BEOL layer after all high-temperature processes are complete on the sensor itself. In this case attachment is performed on a fragile, thin final sensor with only BEOL and epitaxial layers remaining. Thus attachment will need to use only low forces/pressures. Possible low force attachment methods include but are not limited to: directing a gas jet at outer surface of the flexible layer to press and smooth the layer along with low temperature heating to maximize the flexibility and adhesion of the flexible layer. A warm gas jet combines the two effects of smoothing and heating. In a further embodiment, centrifugal force is used to flatten the flexible sheet during adhesion to the BEOL layer of the sensor. In a further embodiment electrostatic-dielectric attraction is used with due care to prevent electrostatic damage to the sensor. Some types of flexible sheets are conductive (graphite-containing for instance) and others are electrically insulating (boron-nitride for instance) and may require different handling in an electrostatic method of attachment.

Powder-based thermal conductors can be deposited directly onto the BEOL layer by settling or slurry coating in a solvent-thinned binder as is done for powder phosphor scintillators. Exemplary binders include but are not limited to sodium silicate, ethyl cellulose, and ammonium polymethacrylate, and cellulose nitrate. While a binder sacrifices some of the thermal conductivity, given the extremely high conductivity of a graphite or boron nitride powder and given sufficiently low binder fraction, the net conductivity will still constitute an improvement over silicon.

Powder-based thermal conductors can also be deposited directly onto the BEOL layer by spin-coating of a liquid powder suspension.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A process for manufacture of a solid state active pixel image sensor comprising a thermal conduction layer comprising:
    forming an epitaxial image sensing layer on a silicon substrate;
    forming a back end of line layer comprising interconnects on top of said epitaxial image sensing layer; and
    applying a thermal conduction layer to said back end of line layer; and
    contact bonding said thermal conduction layer to said back end of line layer and then removing some or all of said substrate and a predetermined amount of said thermal conduction layer.

2. The process of claim 1, wherein said thermal conduction layer comprises a metal, a metal compound, silicon, boron nitride, diamond or graphite.

3. The process of claim 1, further comprising, thinning said thermal conduction layer by polishing, chemo-mechanical polishing, ion milling, or laser ablation.

4. The process of claim 1, further comprising
    forming said thermal conduction layer of a first material on a thermal conduction layer substrate of a second material that is different than said first material and removing said thermal conduction layer substrate after said applying.

5. The process of claim 1, further comprising forming said thermal conduction layer of a first material, doping to a predetermined depth said thermal conduction layer to create doped and non-doped portions and removing said non-doped portion after said adhering.

6. The process of claim 1, further comprising removing some or all of said substrate and wherein said thermal conduction layer comprises a metal, a metal compound, silicon, boron nitride, diamond or graphite.

7. The process of claim 1, further comprising removing some or all of said substrate and thinning said thermal conduction layer by polishing, chemo-mechanical polishing, ion milling, or laser ablation.

8. The process of claim 1 further comprising removing some or all of said substrate to a thickness of between 0 and 5 microns.

9. The process of claim 8 wherein said removing of some or all of said substrate is performed by polishing, chemo-mechanical polishing, ion milling, or laser ablation.

10. A process for manufacture of a solid state active pixel image sensor comprising a thermal conduction layer comprising:

forming an epitaxial image sensing layer on a silicon substrate;

forming a back end of line layer comprising interconnects on top of said epitaxial image sensing layer;

applying a thermal conduction layer to said back end of line layer; and removing some or all of said substrate and forming said thermal conduction layer of a first material, doping to a predetermined depth said thermal conduction layer to create doped and non-doped portions and removing said non-doped portion after said applying.

* * * * *